United States Patent [19]

Imamura

[11] Patent Number: 5,801,655
[45] Date of Patent: Sep. 1, 1998

[54] MULTI-CHANNEL D/A CONVERTER UTILIZING A COARSE D/A CONVERTER AND A FINE D/A CONVERTER

[75] Inventor: Makoto Imamura, Tokyo, Japan

[73] Assignee: Yokogawa Electric Corporation, Tokyo, Japan

[21] Appl. No.: 759,006

[22] Filed: Dec. 2, 1996

[30] Foreign Application Priority Data

Dec. 19, 1995 [JP] Japan .................................. 7-330728

[51] Int. Cl.[6] .................................................... H03M 1/36
[52] U.S. Cl. ............................ 341/145; 341/144; 341/136
[58] Field of Search ................................... 341/145, 156, 341/144, 155, 136, 172

[56] References Cited

U.S. PATENT DOCUMENTS 5,396,245  3/1995  Rempfer ............................... 341/145
5,489,904  2/1996  Hadidi .................................. 341/156

*Primary Examiner*—Brian K. Young
*Assistant Examiner*—Peguy JeanPierre
*Attorney, Agent, or Firm*—Moonray Kojima

[57] ABSTRACT

A digital to analog (D/A) converter which has good monotonicity and is small in scale of circuitry, wherein a coarse D/A converter is separated from the fine D/A converter, and the output from the coarse D/A converter is added to the output from the fine D/A converter, and wherein the coarse D/A converter converts an upper bit digital input signal to an analog output signal, and the fine D/A converter converts a lower bit digital input signal to an analog output signal, wherein differential pairs are provided having different weighted transconductances based on the lower bit digital input signal, and are controlled to add at the same time the converted analog output signal from the fine D/A converter to the converted analog output signal from the coarse D/A converter, whereby resolution is substantially improved.

9 Claims, 3 Drawing Sheets

MULTI-CHANNEL D/A CONVERTER UTILIZING A COARSE D/A CONVERTER AND A FINE D/A CONVERTER

BACKGROUND OF THE INVENTION

1. Field of Invention

This invention relates to a high resolution D/A converter; and, more particularly, to such D/A converter which integrates a multi-channel D/A converter, and which is of small circuitry.

2. Description of the Prior Art

The prior art contains various high resolution D/A converters, such as, for example, a "current-weighted D/A converter; an "R-2R D/A converter", a "PWM D/A converter, and a "ΣΔ D/A converter. The current-weighted D/A converter or the R-2R D/A converter has an analog output signal which can be provided at high speed. The PWM D/A converter or the ΣΔ D/A converter has an analog output signal which does not require high accuracy elements to produce and hence can be of low cost. However, there are problems in that these prior art devices of the first group require high accuracy resistors to obtain monotonicity which results in increased costs. On the other hand, the prior art devices in the latter group are dynamic in operation and require a clock signal. Thus, the latter group of devices are plagued by noise and low speed.

Also in the prior art is the "resistor string D/A converter" or sometimes called the "tap type D/A converter", which has good monotonicity. But, in this type of D/A converter, as the resolution becomes higher, the scale of circuitry expands. To prevent such increase in scale of circuitry, Peter Holloway described a two stage model in "A Trimless 16b Digital Potentiometer" at the 1984 IEEE International Solid State Circuits Conference. However, this Halloway device requires ladder resistors because the least significant bit (LSB) stage also employs a resistor string D/A converter. Hence, it is difficult to obtain a multi-channel D/A converter which is not of large scale circuitry.

SUMMARY OF THE INVENTION

Accordingly, an object of the invention is to overcome the aforementioned and other problems, disadvantages and deficiencies of the prior art.

Another object is to provide a D/A converter which has good monotonicity and is of small circuitry.

DETAILED DESCRIPTION OF THE PREFERRED EMBODIMENTS

Figure 1:
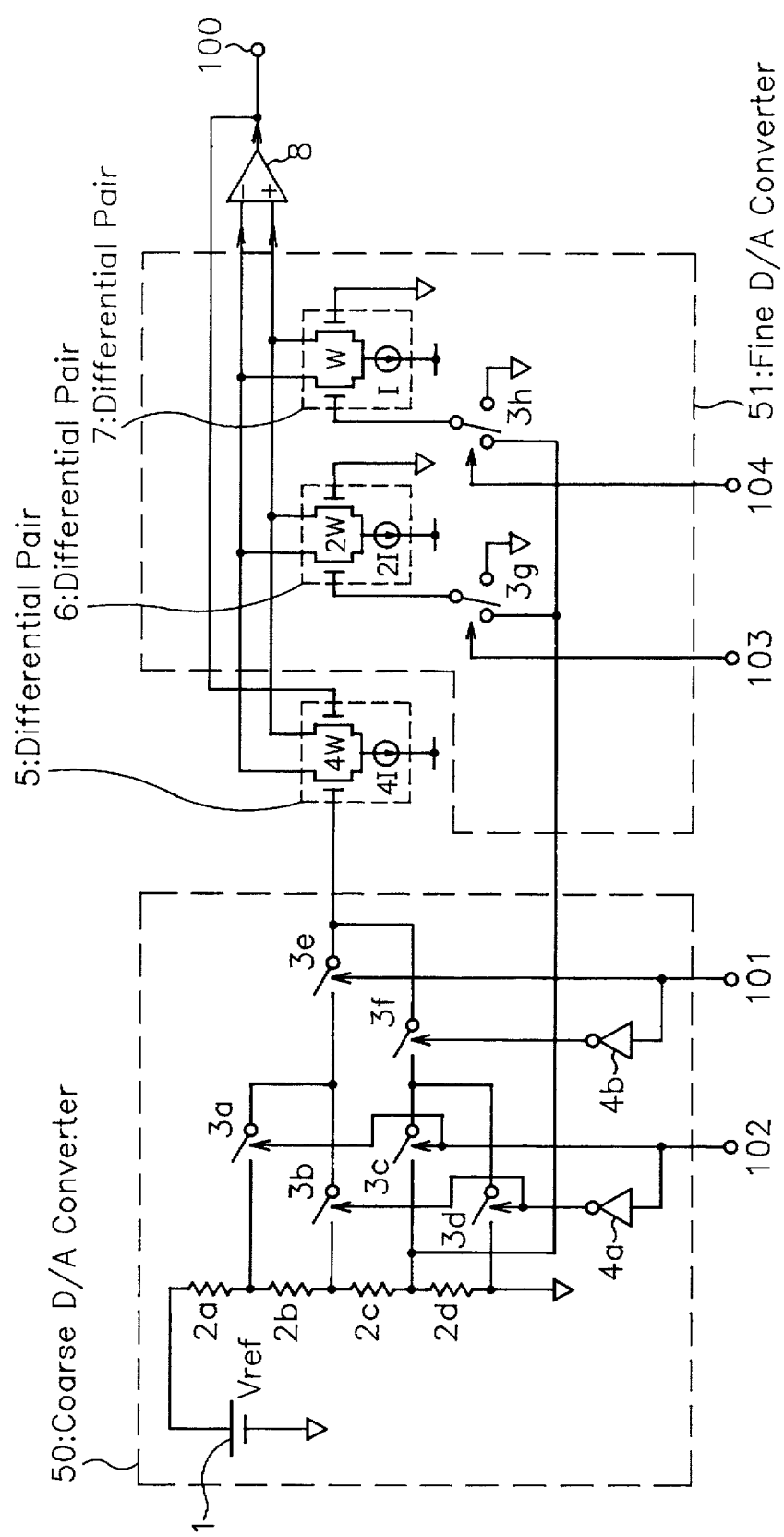
FIG. 1 is a circuit diagram depicting an illustrative embodiment of the invention.

FIG. 1 shows a D/A converter, which is shown as 4-bit D/A converter for sake of simplicity. The converter comprises a reference or constant voltage source 1, resistors 2a,2b,2c, and 2d, switching circuits 3a,3b,3c,3d,3e,3f,3g and 3h, NOT circuits 4a and 4b, differential pairs 5, 6 and 7, each comprising a pair of transistors and a constant current source, and an operational amplifier 8. Also depicted are terminals 100 for an analog output signal and 101,102, 103 and 104 for digital input signals, respectively. Of these the signal applied to terminal 101 is the most significant bit (MSB), and the signal applied to terminal 104 is the least significant bit (LSB).

In FIG. 1, the coarse D/A converter comprises components 1,2a,2b,2c,2d,3a,3b,3c,3d,3e,3f,4a,4b, and 5. The fine D/A converter comprises components 3g,3h,6 and 7. One terminal of constant voltage source 1 is connected to one end of resistor 2a, and the other end of resistor 2a is connected to one end of switching circuit 3a and to one end of resistor 2b. The other end of resistor 2b is connected to one end of switching circuit 3b and to one end of resistor 2c. The other end of resistor 2c is connected to one end of switching circuit 3c, to one end of resistor 2d, and to one input terminal of switching circuits 3g and 3h, respectively. Also, the other end of switching circuit 3a is connected to the other end of switching circuit 3b and to one end of switching circuit 3e. The other end of switching circuit 3c is connected to the other end of switching circuit 3d and to one end of switching circuit 3f.

The other end of switching circuit 3e is connected to the other end of switching circuit 3f and to one input terminal of differential pair 5. One output terminal of differential pair 5 is connected to one output terminal of each of the differential pairs 6 and 7 and also to the inverted input terminal of the operational amplifier 8, respectively. The other output terminal of the differential pair 5 is connected to the other output terminal of each differential pair 6 and 7, and also to the non-inverted input terminal of operational amplifier 8, respectively.

The operational amplifier 8 adds an output signal from the coarse D/A converter 50 to an output signal from the fine D/A converter 51. The output signal from operational amplifier 8 is provided as analog output signal 100. The output terminal of amplifier 8 is connected to the other input terminal of differential pair 5. One input terminal of each differential pair 6, and 7 is connected to the output terminal of switching circuits 3g and 3h, respectively.

The digital signal input terminal 101 is connected to the control terminal of switching circuit 3e and to NOT circuit 4b. The output terminal of NOT circuit 4b is connected to the control terminal of switching circuit 3f. Digital signal input terminal 102 is connected to the control terminals of the swtiching circuits 3a and 3c and to NOT circuit 4a. The output terminal of NOT circuit 4a is connected to the control terminals of switching circuit 3b and 3d, respectively. Also, digital signal input terminals 103 and 104 are connected to the control terminals of switching circuits 3g and 3h, respectively. The other end of constant voltage source 1, the other end of resistor 2d, the other end of switching circuit 3d, the other input terminals of switching circuits 3g and 3h, and other input terminals of differential pairs 6 and 7 are all grounded.

The embodiment of FIG. 1 will now be described. Digital input signals are applied to terminals 101 and 102, i.e., the upper bits to control the ON and OFF states of the switching circuits 3a to 3f. If the output voltage from constant voltage source 1 is "Vref", since resistors 2a to 2d are selected to have equal values, the voltage Vref is equally divided by resistors 2a to 2d. The voltages of (3/4)Vref, (2/4)Vref, (1/4)Vref and (0/4)Vref are applied to the switching circuits 3a,3b,3c and 3d, respectively. Accordingly, if the digital input signals applied to terminals 101 and 102 are both "bit 1", switching circuits 3a,3c and 3e are turned ON, switching circuits 3b,3d and 3f are turned OFF, and the voltage of (3/4) Vref is applied to one input terminal of differential pair 5.

Since the analog output signal taken from terminal 100 is fed back to the other input terminal of differential pair 5, if the differential pairs 6 and 7 are not operating, the analog output signal from terminal 100 becomes voltage (3/4)Vref. In a similar manner, the analog output signal obtained from terminal terminal 100 becomes a voltage (2/4)Vref when the digital input signal applied to terminals 101 and 102 are "bit 1", and "bit 0", respectively; a voltage (1/4)Vref when the digital input signals applied to terminals 101 and 102 are "bit 1" and "bit 0", respectively; and a voltage (0/4)Vref when the digital input signals applied to terminals 101 and 102 are both "bit 0". On the other hand, digital input signals applied to terminals 103 and 104, i.e. the lower bits, control switching circuits 3g and 3h, respectively. Switching circuits 3g and 3h select a voltage (1/4)Vref when the digital input signals applied to terminals 103 and 104 are both "bit 1", and are equal to ground when the digital input signals applied to the terminals 103 and 104 are both "bit 0", that is (0/4)Vref is then selected. For differential pairs 5, 6 and 7, the output currents of the constant current sources and sizes (i.e. gate width) of the transistors comprising each differential pair are set to 4I and 4W, 2I and 2W, and I and W, respectively, so that transconductance of each pair is 4gm, 2gm, and 1gm, respectively.

Hence, when the digital input signals applied to terminals 103 and 104 are "bit 1" and "bit 0", respectively, a voltage (1/4)Vref is applied only to the differential pair 6 and the difference of 2gm×(1/4)Vref is generated between each output terminal of differential pair 6. When upper bit digital input signals applied to terminals 101 and 102 are both "bit 0", the voltage at one input terminal of differential pair 5 is (0/4)Vref; and as the differential output current, the output voltage from differential pair 6 to amplifier 8 is 2gm×(1/4) Vref. However, the input values to the two input terminals of operational ampliffier 8 must be equal. Thus, the analog output signals applied to terminal 100 are controlled so that a drain current of −2gm×(1/4) Vref flows as the differential output current output from differential pair 5 to amplifier 8.

Since the transconductance of differential pair 5 is 4gm, the analog output signal Vout is as follows:

$$Vout=[2gm\times(1/4)Vref]/4gm=2/16\times Vref \quad (1)$$

For example, if both the upper bit digital input signals applied to terminals 101 and 102 are changed to bit 1" in this condition, Vout is changed as shown below because, as described above, (3/4)Vref is added to equation (1), that is to say:

$$Vout=(2/16+12/16)Vref=14/16\times Vref \quad (2)$$

In that manner, a 4-bit D/A converter is realized, wherein by changing the digital input signals applied to terminals 101 to 104 to "0000", "0001", and to "1110" and "1111". The analog output signal at terminal 100 is changed to (0/16)Vref, (1/16)Vref and to (14/16)Vref, (15/16)Vref.

Accordingly, monotonicity becomes better by using a "resistor string" with the coarse D/A converter and the scale of the circuit can thus be made smaller by using "transconductance weighting" for the fine D/A converter. In that way, the number of resistors and switching circuits required to select taps in the resistor string is reduced.

In addition, if a multiple D/A converter is to be integrated, since the resistor array comprising resistors 2a–2d can be used in common, power consumption can be reduced and the scale of circuitry need not be increased. Furthermore, if automatic calibration is used, it is sufficient to use a small capacity memory because the calibration data can be used in common.

As a result, monotonicity becomes better and the circuit scale can be made smaller by separating the coarse D/A converter from the fine D/A converter, and by using a resistor string as the upper bit conversion circuit, and further by using the "transconductance weighting" as the lower bit conversion circuit. To process the upper bits, the "resistor string", "R-2R" or "current addition" types of circuits can be used. In addition, although the lower bits are weighted by using more than one differential pair in the embodiment of FIG. 1, the output signal of a separately provided D/A converter may be used as the input voltage for the differential pair.

Figure 2:
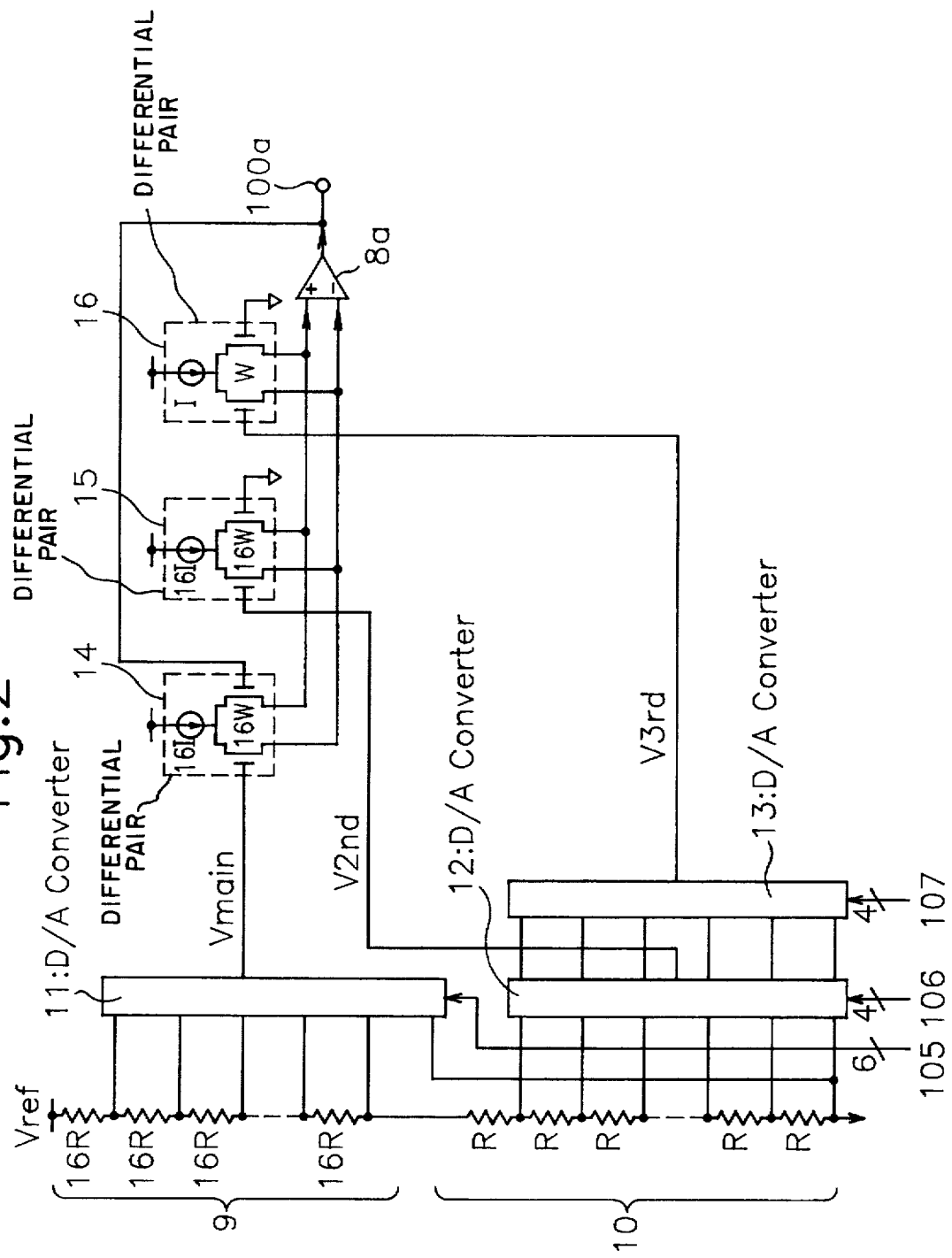
FIG. 2 is a circuit diagram depicting another illustrative embodiment of the invention.

FIG. 2 shows an operational amplifier 8a, resistor array 9,10, D/A converters 11,12,13 using "resistor strings", and differential pairs 14,15,16 comprising a pair of transistors and a constant current source. Also, an analog output signal is provided at the output terminal 100a, and digital signals are applied to terminals 105,106,107. The upper bits are applied to terminal 105. The intermediate bits are applied to terminal 106. The lower bits are applied to terminal 107.

A reference voltage is applied to one end of resistor array 9 whose other end is connected to one end of resistor array 10. The other end of resistor array 10 is grounded. Each tap voltage in resistor array 9 is supplied to D/A converter 11. Each tap voltage in resistor array 10 is supplied to D/A converters 12 and 13.

Each output terminal of D/A converters 11,12 and 13 is connected to one input terminal of each differential pair 14,15, and 16, respectively. The other input terminals of differential pairs 15 and 16 are grounded. One output terminal of differential pair 14 is connected to one output terminal of each differential pair 15 and 16 and to one input terminal of operational amplifier 8a, respectively. Also, the other output terminal of differential pair 14 is connected to the other output terminals of differential pairs 15 and 16 and to the other input terminal of the operational amplifier 8a, respectively.

The output terminal of the operational amplifier 8a provides analog output signals for terminal 100a which is connected to the other input terminal of the differential pair 14. Also, digital input terminals 105,106, and 107 are connected to D/A converters 11, 12, and 13, respectively.

Let the weighting to differential pairs 14, 15 and 16 be "16", "16" and "1", respectively, and let the output voltages from D/A converters 11, 12 and 13 be "Vmain", "V2nd" and "V3rd", respectively. Then, the analog output voltage signal at terminal 100a is expressed as follows:

$$Vout=Vmain+(16/16)V2nd+(1/16)V3rd \quad (3)$$

However, since the resistor array 9 and resistor array 10 are weighted in the example to be 16:1 in resistance value, the values of the signals produced by D/A converters 11 and 12 are also weighted by the same ratio of 16:1. Such example would be applicable to the D/A converter shown in FIG. 2. In addition, in FIG. 2, when the output signals from D/A converters 12 and 13 for the intermediate and lower bits are assumed to be the voltage of a specific tap of the resistor array 10, the difference in the common mode voltage between the differential pairs degrades the matching of the transconductances of the transistors which make up the differential pairs. Thus, the linearity of the D/A converter as a whole may become degraded.

Figure 3:
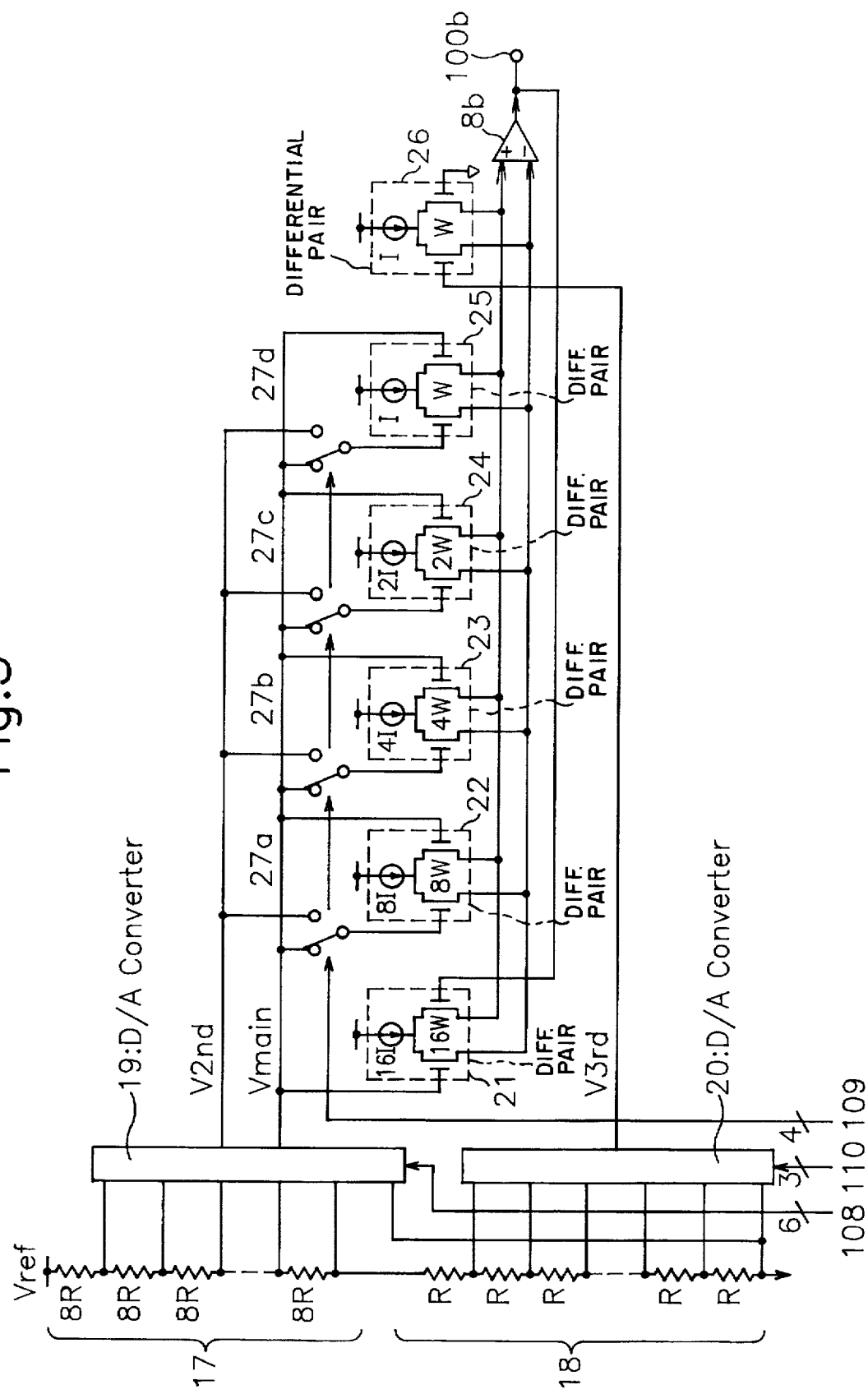
FIG. 3 is a circuit diagram depicting a further illustrative embodiment of the invention.

FIG. 3 shows a circuit diagram of a D/A converter which prevents such degradation of the linearity and which comprises an operational amplifier 8b, resistor arrays 17 and 18, D/A converters 19, and 20 comprising a resistor string, differential pairs 21–26, each comprising a pair of transistors and a constant current source, and switching circuits 27a–27d. An analog output signal is provided at terminal 100b and digital input signals are supplied to terminals 108–110, with the signal applied to terminal 108 being of upper bits, the signals applied to terminal 108 being of intermediate bits, and the signal applied to terminal 110 being of lower bits.

A reference voltage is applied to one end of resistor array 17, whose other end is connected to one end of resistor array 18. The other end of resistor array 18 is grounded. The voltage at each tap of resistor array 17 is applied to the D/A converter 19, and the voltages at each tap of resistor array 18 is applied to the D/A converter 20, respectively.

The output from the D/A converter 19 "Vmain" is supplied to one input terminal of differential pairs 21–25 and to one input terminal of switches 27a to 27d, respectively. Furthermore, tap voltage "V2nd", obtained adjacent to tap voltage "Vmain" is supplied to each of the other input terminals of the switching circuits 27a to 27d. The outut signal from the D/A converter 20 "Vrd" is supplied to one input terminal of differential pair 26, whose other input terminal is grounded. One output terminal of differential pair 21 is connected to one output terminal of each differential pair 22–26, and to one input terminal of amplifier 8b, respectively.

The other output terminal of differential pair 21 is connected to the other output terminal of differential pairs 22–26, and to the other input terminal of amplifier 8b, respectively.

The output terminal of amplifier 8b provides output analog signals at terminal 100b which is supplied to the other input terminal of the differential pair 21. Also, digital input signals supplied to terminals 108 and 110 are supplied to D/A converters 19 and 20, respectively. On the other hand, the digital input signal supplied to terminal 109 is supplied to each control terminal of switching circuits 27a to 27d. The difference in common mode voltages between the differential pairs is eliminated in such an embodiment. Also, since the matching of transconductances of the transistors comprising each differential pair is not changed, degradation of linearity of the entire D/A converter is eliminated. In the embodiment of FIG. 3, advantageously, the voltage between the adjacent taps is not used for the lower bits. Moreover, although it is suitable to use a CMOS process for exploiting the resistor string, the invention is not limited to use of such CMOS process for the differential pairs.

The foregoing disclosure is illustrative of the principles of the invention. Numerous extensions and modifications thereof would be apparent to the worker skilled in the art. All such extensions and modifications are to be considered to be within the spirit and scope of the invention.

What is claimed is:

1. A D/A converter which improves resolution by separating an upper-bit conversion circuit from a lower-bit conversion circuit and by adding output from said upper-bit conversion circuit to output from said lower-bit conversion circuit, said converter comprising:

said upper-bit conversion circuit that converts an upper-bit digital input signal to an analog output signal;

said lower-bit conversion circuit that converts a lower-bit digital input signal by controlling differential pairs, the number of which is the same as the number of lower bits, and in which transconductances are weighted respectively based on the lower-bit digital input signal; and an addition circuit which adds the output from said upper-bit conversion circuit to the output from said lower-bit conversion circuit.

2. The converter of claim 1, wherein said upper-bit conversion circuit comprises:

a reference voltage source;

a resistor array for dividing output voltage from said reference voltage source; and switching circuit for selectively outputting a voltaged divided by said resistor array based on an upper-bit digital input signal.

3. The converter of claim 1, wherein said addition circuit comprises:

a differential pair, to one of whose input terminals the output voltage from said upper-bit conversion circuit is applied; and an operational amplifier comprising an inverted input terminal and a non-inverted input terminal, and wherein two current outputs from said differential pair are connected to said inverted and non-inverted input terminals, respectively, an analog output signal is outputted, and at the same time said analog output signal is fed back to another input terminal of said differential pair.

4. The converter of claim 3, wherein said lower-bit conversion circuit comprises:

differential pairs, the number of which is the same as the number of lower-bits, and in which transconductances are weighted based on the lower-bit digital input signal, and in which each input terminal is grounded and at the same time two current outputs are connected to said addition circuit, respectively; and switching circuit that applies a reference voltage to other input terminals of said differential pair based on said lower-bit digital input signal.

5. The converter of claim 4, wherein transconductances of said differential pairs of said lower-bit conversion circuit are weighted to the transconductances of the differential pair of said addition circuit based on the lower-bit digital input signal.

6. A D/A converter which improves resolution by separating an upper-bit conversion circuit from a lower-bit conversion circuit and by adding output from said upper-bit conversion circuit to output from said lower-bit conversion circuit, said converter comprising:

said upper-bit conversion circuit that converts an upper-bit digital input signal to an analog output signal and at the same time outputs a reference voltage whose value is nearest to the converted analog voltage;

said lower-bit conversion circuit that converts a lower-bit digital input signal to an analog output signal;

an intermediate-bit conversion circuit that converts an intermediate-bit digital input signal by controlling differential pairs, the number of which is the same as the number of said intermediate bits, and in which transconductances are weighted respectively based on said output signal and said output reference voltage of said upper-bit conversion circuit, the output voltage of said lower-bit conversion circuit, and an intermediate-bit digital input signal; and an addition circuit that adds up output from said upper-bit conversion circuit, output from said intermediate-bit conversion circuit, and output from said lower-bit conversion circuit.

7. The converter of claim 6, wherein said addition circuit comprises:

a first differential pair, to one of whose input terminals the output voltage from said upper-bit conversion circuit is applied;

a second differential pair in which the transconductances are weighted to the transconductances of said first differential pair, the output of said lower-bit conversion circuit is applied to one input terminal and at the same time the other input terminal is grounded; and an operational amplifier comprising an inverted input terminal and a non-inverted input terminal and wherein two current outputs from said first and second differential pairs are connected to said inverted and non-inverted input terminals, respectively, an analog output signal is outputted, and at the same time said analog output signal is fed back to the the other input terminal of said first differential pair.

8. The converter of claim 7, wherein said intermediate-bit conversion circuit comprises:

differential pairs, the number of which is the same as the number of intermediatel bits, and in which transconductances are weighted based on the intermediate-bit digital input signal, each input terminal is grounded, and at the same time two current outputs are connected to said addition circuit, respectively; and switching circuit that applies a reference voltage to the other input terminals of said differential pairs based on the intermediate-bit digital input signal.

9. The converter of claim 8, wherein transcnductances of said differential pairs of said intermediate-bit conversion circuit are weighted to the transconductances of said first differential pair of said addition circuit based on the intermediate-bit digital input signal.

* * * * *